(12) United States Patent
Uchida

(10) Patent No.: US 9,287,146 B2
(45) Date of Patent: Mar. 15, 2016

(54) INDUCTION HEATING APPARATUS AND INDUCTION HEATING METHOD

(75) Inventor: Naoki Uchida, Tamano (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 0 days.

(21) Appl. No.: 13/994,547

(22) PCT Filed: Aug. 31, 2011

(86) PCT No.: PCT/JP2011/069798
§ 371 (c)(1),
(2), (4) Date: Jun. 14, 2013

(87) PCT Pub. No.: WO2012/086268
PCT Pub. Date: Jun. 28, 2012

(65) Prior Publication Data
US 2013/0264335 A1  Oct. 10, 2013

(30) Foreign Application Priority Data

Dec. 24, 2010  (JP) .................................. 2010-288396

(51) Int. Cl.
*H05B 6/10* (2006.01)
*H01L 21/67* (2006.01)
(Continued)

(52) U.S. Cl.
CPC .......... *H01L 21/67103* (2013.01); *H05B 6/105* (2013.01); *H05B 6/36* (2013.01); *H05B 6/42* (2013.01); *H05B 6/44* (2013.01)

(58) Field of Classification Search
CPC ............. H05B 6/02; H05B 6/10; H05B 6/105
USPC ......... 219/600, 603, 618, 624, 633, 634, 635, 219/647, 656; 438/12–15, 663, 676
See application file for complete search history.

(56) References Cited

U.S. PATENT DOCUMENTS 5,690,742 A * 11/1997 Ogata et al. .................... 118/500
6,070,495 A *  6/2000 Kuroda et al. .................. 74/650
(Continued)

FOREIGN PATENT DOCUMENTS

CN       101494163 A    7/2009
EP       1 271 620 A1   1/2003
(Continued)

OTHER PUBLICATIONS

International Search Report from the International Bureau in corresponding International Application No. PCT/JP2011/069798, mailed Oct. 4, 2011, pp. 1-3.
(Continued)

*Primary Examiner* — David Angwin
*Assistant Examiner* — Michael Laflame, Jr.
(74) *Attorney, Agent, or Firm* — Juan Carlos A. Marquez; Bacon & Thomas PLLC

(57) ABSTRACT

To provide an induction heating apparatus that employs a batch-type heating system for heating a large-diameter wafer and can perform uniform heating with a high precision, an induction heating apparatus (10) that heats an inductive-heating target member using a magnetic flux generated from a solenoid-type induction heating coil (18) and heats a wafer (40) using the heat generated from the inductive-heating target member, wherein a plurality of inductive-heating target members 14 (14a, 14b, and 14c) of which principal surface is arranged perpendicularly to a core axis direction of the induction heating coil (18) are interspersed. In the induction heating apparatus (10) described above, a susceptor (12) may be configured by housing the inductive-heating target member (14) in a single holder (16) made of a member having magnetic permeability and heat conductivity.

9 Claims, 7 Drawing Sheets

(51) Int. Cl.
  *H05B 6/36* (2006.01)
  *H05B 6/42* (2006.01)
  *H05B 6/44* (2006.01)

(56) References Cited

U.S. PATENT DOCUMENTS

| | | | |
|---|---|---|---|
| 6,245,152 B1* | 6/2001 | Imai et al. | 118/728 |
| 2003/0010775 A1* | 1/2003 | Kim | 219/634 |
| 2003/0085223 A1* | 5/2003 | Zeng et al. | 219/725 |
| 2004/0007677 A1* | 1/2004 | Takekoshi | 250/492.2 |
| 2005/0186723 A1 | 8/2005 | Kim | |
| 2005/0211700 A1* | 9/2005 | Kondo et al. | 219/619 |
| 2006/0096972 A1* | 5/2006 | Nakamura | 219/444.1 |
| 2007/0125762 A1* | 6/2007 | Cui et al. | 219/444.1 |
| 2008/0079008 A1* | 4/2008 | Yonezawa | H01L 21/02378 257/77 |
| 2008/0118641 A1* | 5/2008 | Ranish et al. | 427/248.1 |
| 2009/0075409 A1* | 3/2009 | Ueno et al. | 438/22 |
| 2009/0184109 A1 | 7/2009 | Sawada et al. | |

FOREIGN PATENT DOCUMENTS

| | | |
|---|---|---|
| JP | 63-012127 | 1/1988 |
| JP | 2003-007638 A | 1/2003 |
| JP | 2006-278150 A | 10/2006 |
| JP | 2009-238375 A | 10/2009 |
| WO | WO 2010/047155 A1 | 4/2010 |

OTHER PUBLICATIONS

Office Action from People's Republic of China Intellectual Property Office in the corresponding Chinese application 201180046429.9 dated Oct. 1, 2014, 9 pp. in Chinese.

\* cited by examiner

INDUCTION HEATING APPARATUS AND INDUCTION HEATING METHOD

TECHNICAL FIELD

The present invention relates to an induction heating apparatus and an induction heating method, and more particularly, to an induction heating apparatus and an induction heating method suitable for a case where a heating target is uniformly heated.

BACKGROUND ART

A wafer heating technology has been rapidly developed after an induction heating technique is employed in the field of semiconductor heating. Recently, a wafer size as a heating target significantly increases, some of which reach 300ϕ. Typically, for such large-diameter wafers, a single-wafer heating system is employed, in which every single wafer is heated by an induction heating coil arranged along a susceptor surface as a heat generator for heating the wafer, as disclosed in Japanese Unexamined Patent Application No. 2006-278150.

On the contrary, in order to achieve efficient heat treatment, a so-called batch heating type is desirably employed in an induction heating apparatus 1, in which a lateral batch-type induction heating coil 2 such as a solenoid coil is used as illustrated in FIG. 11. However, when a large wafer is heated using the lateral batch-type induction heating coil 2, a heat generation amount in the susceptor 3 becomes significant in the outer edge side due to influence of a skin effect, and the heat generation amount in the center side becomes short. For this reason, it is difficult to uniformly heat the wafer 4 and practically employ such an induction heating apparatus. FIG. 12 is a diagram illustrating a configuration of the susceptor employed in the induction heating apparatus 1 of the related art, in which the susceptor is made of, for example, a single member such as graphite.

CITATION LIST

Patent Literatures

[Patent Literature 1] Japanese Unexamined Patent Application No. 2006-278150

DISCLOSURE OF INVENTION

Problem to be Solved by the Invention

As described above, the single-wafer heating system and the batch-type heating system have both advantages and disadvantages. For this reason, a heating means is selected depending on which of quality or efficiency an operator focuses on when heat treatment is performed. However, it is difficult to perform heat treatment of a large wafer using a batch-type heating system.

Embodiments of the present invention have been made to address the aforementioned problems and provide an induction heating apparatus and an induction heating method capable of performing high-precision uniform heating by employing a batch-type heating system to heat a large-diameter wafer.

Means for Solving Problem

According to an aspect of the present invention, there is provided an induction heating apparatus that heats an inductive-heating target member using a magnetic flux generated from a solenoid coil and heats a heating target member using the heat generated from the inductive-heating target member, wherein a plurality of inductive-heating target members of which principal surface is arranged perpendicularly to a core axis direction of the solenoid coil are interspersed.

In the induction heating apparatus described above, it is preferable that the inductive-heating target members be housed in a single holder made of a member having magnetic permeability and heat conductivity to provide a heat generator.

In this configuration, a path for transmitting a magnetic flux emitted from the induction heating coil is provided on a plate surface of the heat generator. Therefore, even when the heat generator is arranged in a layered structure, it is possible to cause the magnetic flux to reach the vicinity of the center of the heat generator.

In the induction heating apparatus described above, it is preferable that the inductive-heating target members have a circular shape and be interspersed radially by using a center of the holder as an origin. In this configuration, it is possible to stabilize a distribution of the heat generated from the heat generator.

In the induction heating apparatus described above, it is preferable that the inductive-heating target member arranged in the center of the holder have a diameter larger than that of the inductive-heating target member arranged in an outer circumference side of the holder.

In this configuration, it is possible to change a heat generation rate within the surface of the heat generator based on a frequency of the electric current supplied to the induction heating coil.

In the induction heating apparatus described above, it is preferable that the inductive-heating target member arranged in the center of the holder have a thickness larger than that of the inductive-heating target member arranged in an outer circumference side of the holder.

In this configuration, it is possible to change a heat capacity within the surface of the heat generator. Therefore, uniform heating can be advantageously achieved by increasing the heat capacity in the center where it is difficult to generate heat.

In the induction heating apparatus described above, it is preferable that a through-hole be formed in each center of the circular inductive-heating target members so that each inductive-heating target member has a ring shape.

In this configuration, it is possible to widen a transmission path of the magnetic flux.

In the induction heating apparatus described above, it is preferable that a circular inductive-heating target member be arranged in a center of the holder, and a plurality of fan-shaped inductive-heating target members be arranged around the circular inductive-heating target member.

In the induction heating apparatus described above, it is preferable that, assuming that the inductive-heating target member arranged in a center side of the heat generator is a first inductive-heating target member, and the inductive-heating target member arranged in an outer circumference side of the heat generator is a second inductive-heating target member, the first inductive-heating target member can obtain a heat density higher than that of the second inductive-heating target member when a frequency of an electric current supplied to the solenoid coil of the first inductive-heating target member is lower than that of the second inductive-heating target member.

According to another aspect of the present invention, there is provided an induction heating apparatus that heats an inductive-heating target member using a magnetic flux generated from a solenoid coil and heats a wafer using a radiation heat of the inductive-heating target member, wherein the inductive-heating target member of which principal surface is arranged perpendicularly to a core axis direction of the solenoid coil, a thin portion and a thick portion are formed in the inductive-heating target member, and the inductive-heating target member is housed in a holder made of a member having magnetic permeability and heat conductivity to provide a heat generator.

In the induction heating apparatus described above, it is preferable that a plurality of the heat generators be arranged in the enclosed space in parallel with each other.

According to still another aspect of the present invention, there is provided an induction heating method for heating a heat generator arranged in an enclosed area of a solenoid coil by supplying an electric current to the solenoid coil to heat a heating target member, wherein a temperature of the wafer is controlled by using, as a reference frequency, a frequency of an electric current that can uniformly heat the heat generator, such that a center of the heat generator is heated in a case where an electric current having a frequency lower than the reference frequency is supplied to the solenoid coil, and an outer circumference of the heat generator is heated in a case where an electric current having a frequency higher than the reference frequency is supplied to the solenoid coil.

In the induction heating method described above, it is preferable that a plurality of the heat generators be arranged in the enclosed area of the solenoid coil in parallel with each other, the solenoid coil be divided along an arrangement direction of the heat generators, electric currents supplied to each of the solenoid coils be controlled such that frequencies and phases of the electric currents supplied to each of the divided solenoid coils match each other.

In this configuration, it is possible to control supply of an electric current to the induction heating coil while influence of the mutual induction generated between neighboring induction heating coils is avoided.

Effect of the Invention

In the induction heating apparatus and the induction heating method described above, it is possible to perform uniform heating with a high precision even when a batch-type heating system is employed to heat a large-diameter wafer.

BEST MODE(S) FOR CARRYING OUT THE INVENTION

Hereinafter, an induction heating apparatus and an induction heating method according to an embodiment of the present invention will be described in detail with reference to the accompanying drawings.

Figure 1:
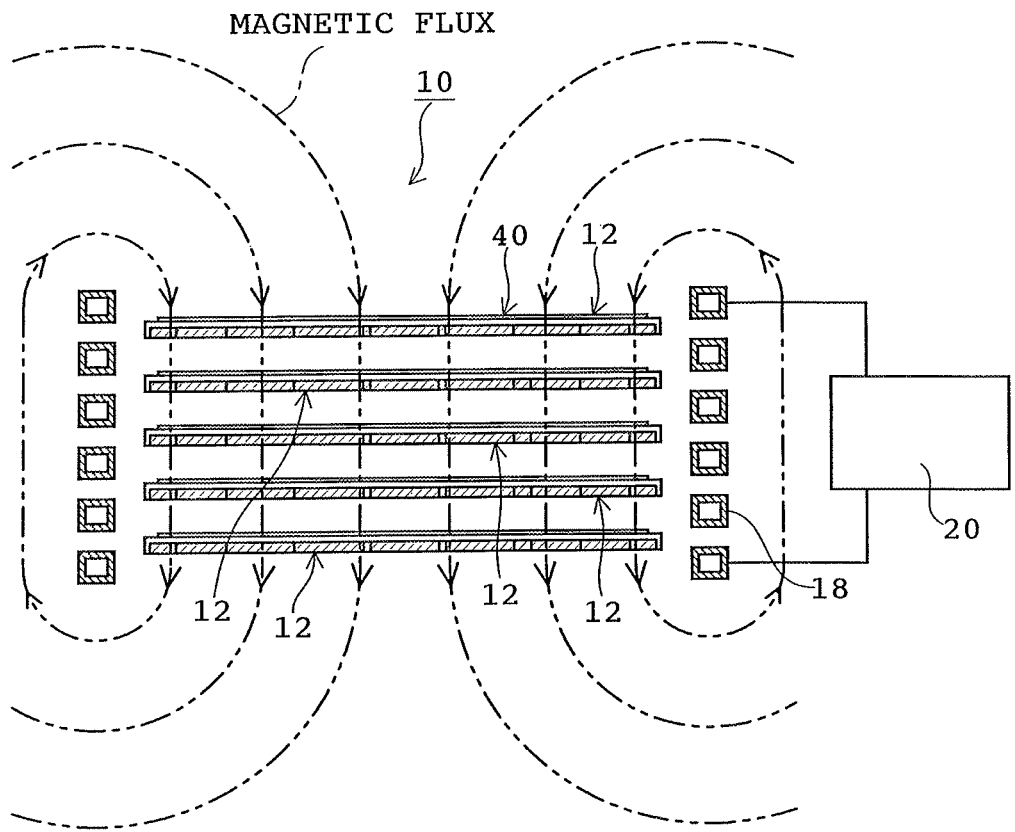
FIG. 1 is a block diagram illustrating a front configuration of an induction heating apparatus according to Embodiment 1.
Figure 2:
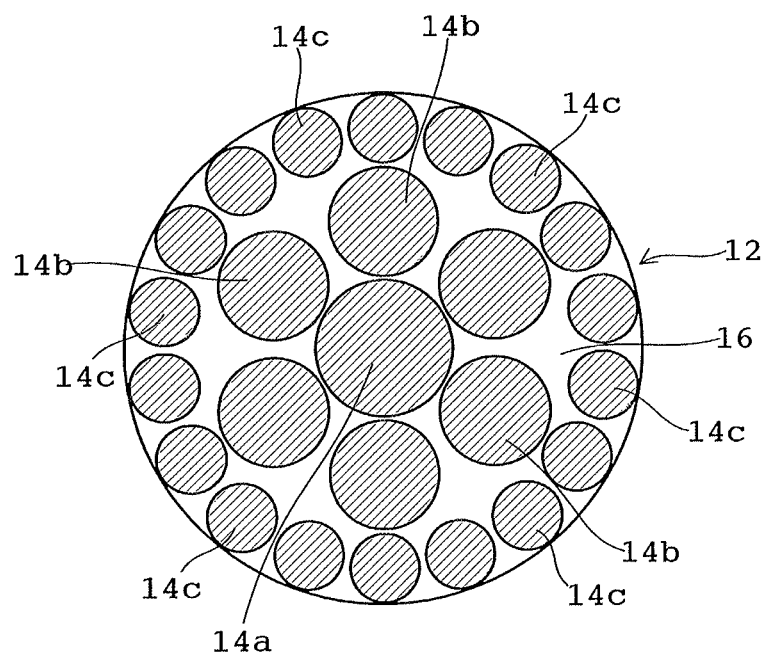
FIG. 2 is a top plan view illustrating a configuration of a susceptor employed in the induction heating apparatus according to Embodiment 1.

First, an induction heating apparatus according to Embodiment 1 of the present invention will be described in detail with reference to FIGS. 1 and 2. Here, FIG. 1 is a block diagram illustrating a front configuration of the induction heating apparatus according to the present embodiment. FIG. 2 is a top plan view illustrating a susceptor of the induction heating apparatus.

The induction heating apparatus 10 according to the present embodiment at least includes a susceptor 12 as a heat generator and an induction heating coil 18, and a power supply unit 20. The susceptor 12 according to the present embodiment is a circular flat plate including an inductive-heating target member 14 (14a to 14c) and a holder 16. A semiconductor wafer (hereinafter, simply referred to as a wafer 40) as a heating target is disposed on the susceptor 12, and the disposed wafer 40 is heated through a heat transmission and a heat conduction effect. The inductive-heating target member 14 may be a resistance member having thermal resistance and electric conductivity. For example, the inductive-heating target member 14 may be a circular flat plate made of graphite and the like. According to the present embodiment, the inductive-heating target member 14 is configured as a circular disc having a diameter smaller than that of the susceptor 12, and the susceptor 12 is configured by interspersing the inductive-heating target members 14 in the holder 16. The holder 16 may be a high-heat-conductivity member having thermal resistance and magnetic permeability. For example, the holder 16 is made of SiC and the like, and a body of the holder 16 is formed by coating the interspersed inductive-heating target members 14. Since SiC has high heat conductivity, a heat-distribution is not biased even when the inductive-heating target members 14 are interspersed. In addition, each inductive-heating target member 14 is arranged such that a principal surface thereof is perpendicular to a winding center (core axis direction) of the induction heating coil 18 described below. As a result, a magnetic flux is supplied perpendicularly to the principal surface of the inductive-heating target member 14, and an eddy current is excited in parallel with the plate surface of the inductive-heating target member 14. Therefore, the heat-generating efficiency is improved.

According to the present embodiment, as illustrated in FIG. 2, the susceptor 12 includes a plurality of inductive-heating target members 14 having different diameters. Specifically, assuming that the inductive-heating target members 14 are classified into large-diameter, middle-diameter, and small-diameter inductive-heating target members 14a, 14b, and 14c, respectively, the large-diameter inductive-heating target member 14a is arranged in the center, and the middle-diameter inductive-heating target members 14b are arranged radially around the large-diameter inductive-heating target member 14a. In addition, the small-diameter inductive-heating target members 14c are arranged radially in an outer circumference side from the middle-diameter inductive-heating target members 14b. Here, if the diameter of the susceptor 12 is set to 300φ, for example, the diameter of the large-diameter inductive-heating target member 14a may be set to 50φ, the diameter of the middle-diameter inductive-heating target member 14b may be set to 30φ, and the diameter of the small-diameter inductive-heating target member 14c may be set to 20φ.

The inductive-heating target member 14 has a different heat generation amount Q depending on a current penetration depth δ, a current value supplied to the induction heating coil 18, and a frequency thereof. In general, as the electric current frequency decreases, the heat-generating efficiency (heat density) of the large-diameter inductive-heating target member increases. In addition, as the electric current frequency increases, the heat-generating efficiency of the small-diameter inductive-heating target member increases. Therefore, if a plurality of inductive-heating target members having different diameters are arranged from the center to the outer edge as described above, it is possible to select an effective heating portion on the surface of the susceptor depending on the setting of the electric current frequency. Each number of the large-diameter, middle-diameter, and small-diameter inductive-heating target members and arrangement balance thereof may be determined such that a heat distribution in an area where the inductive-heating target members are arranged becomes uniform.

According to the present embodiment, a batch-type heating system is employed by arranging a plurality of susceptors 12 having such a configuration in a layered manner.

According to the present embodiment, as the induction heating coil 18, a so-called solenoid type coil is employed, in which the coil is wound so as to enclose a plurality of susceptors 12 layered as described above. In a case where the induction heating coil 18 arranged in this manner is employed, a magnetic flux generated by supplying electric power to the induction heating coil 18 follows a layering direction of the susceptors 12 as illustrated in FIG. 1.

The magnetic flux generated from the induction heating coil 18 is decayed by the resistance when it transmits through a conductive resistance member (for example, graphite) of the susceptor. For this reason, in a case where the susceptor of the related art is employed, the electromagnetic induction heating becomes insufficient near the centers of the layered susceptors.

On the contrary, according to the present embodiment, the inductive-heating target members 14 made of a conductive resistance member are interspersed in the holder 16 made of a magnetic permeable member. Therefore, it is possible to form a magnetic flux transmission path inside the susceptor 12. For this reason, using the inductive-heating target members 14 interspersed inside the holder 16, it is possible to increase a heating rate of each outer edge portion. As a result, the in-plane heat distribution is improved in the overall layered susceptors 12.

According to a preferable embodiment, the induction heating coil 18 may be a member that includes a outside body made of a conductive member having thermal resistance and an interior space where a cooling member can be inserted (for example, hollow copper tube). In this configuration, it is possible to prevent the induction heating coil 18 from being overheated due to radiation of the heat generated by the susceptor 12 based on the electromagnetic induction. Preferably, a thermally resistant insulating member may be coated around the outer circumference of the induction heating coil 18. In this configuration, it is possible to prevent a short circuit caused by an undesired contact.

Figure 9:
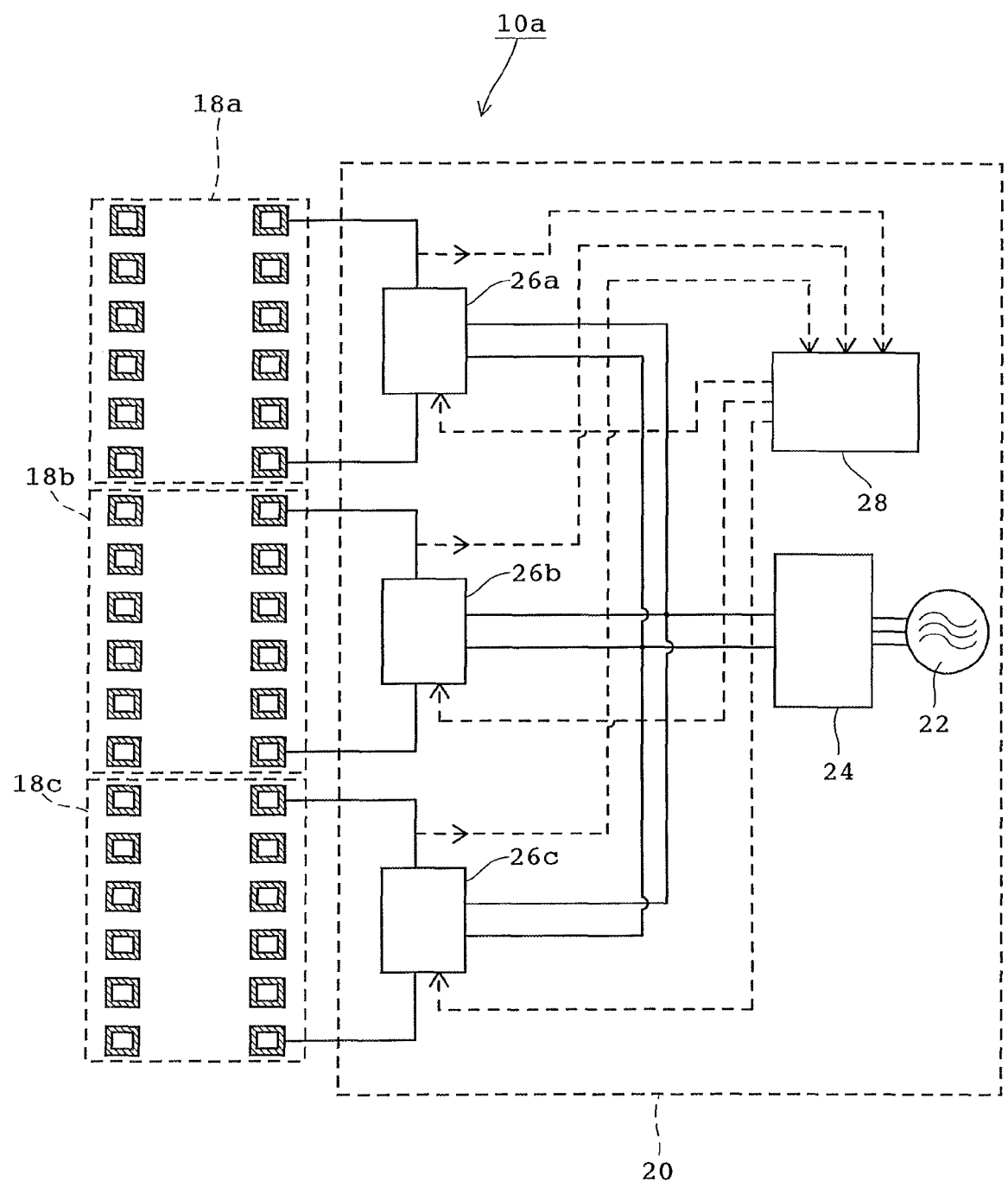
FIG. 9 is a diagram for describing a configuration of a power supply unit in the induction heating apparatus according to Embodiment 2.
Figure 10:
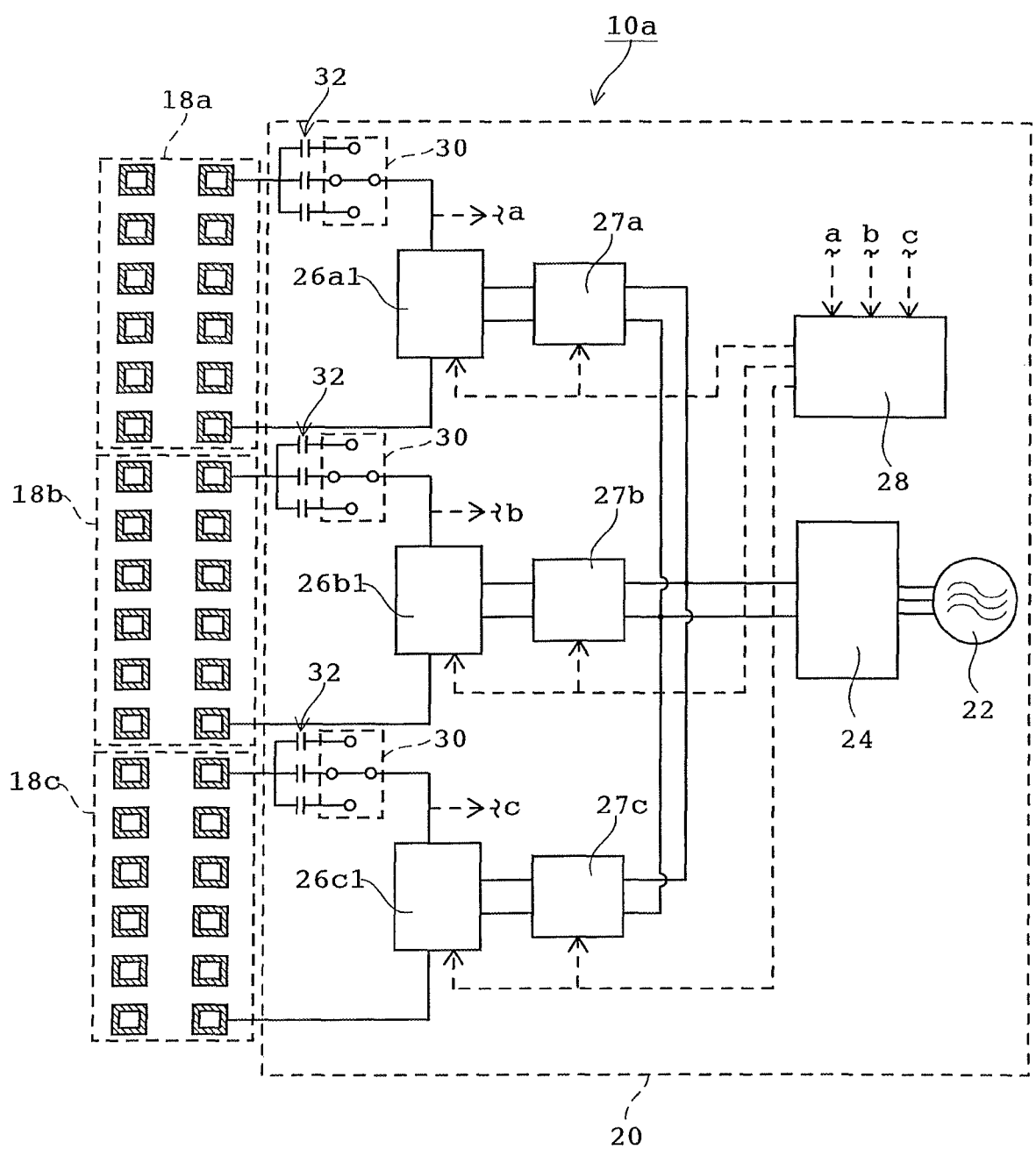
FIG. 10 is a diagram illustrating an example in which a series resonant inverter is employed as an inverter of the induction heating apparatus according to Embodiment 2.
Figure 11:
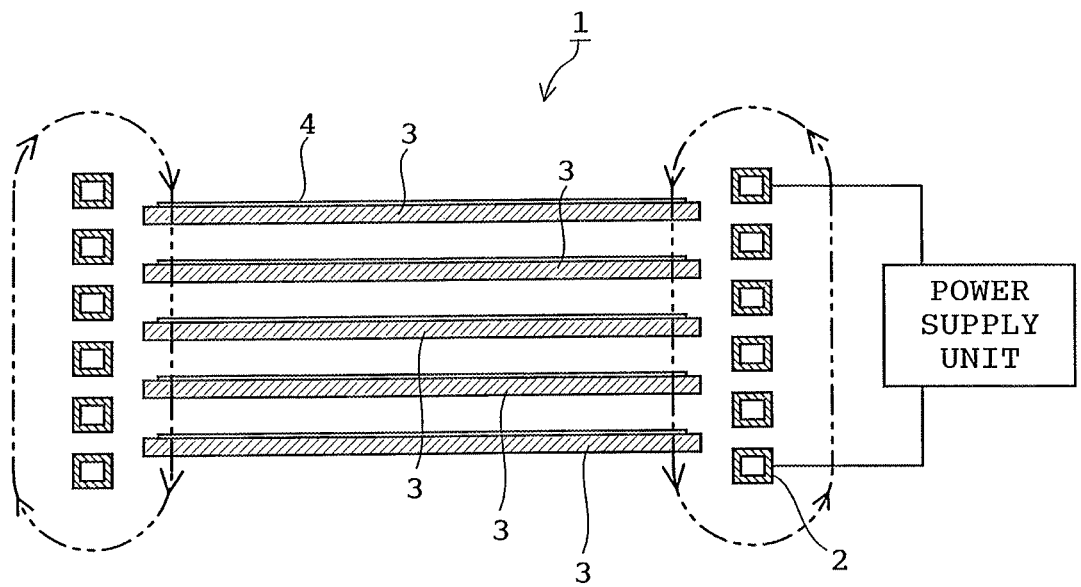
FIG. 11 is a front view illustrating a configuration of a batch-type induction heating apparatus of the related art.
Figure 12:
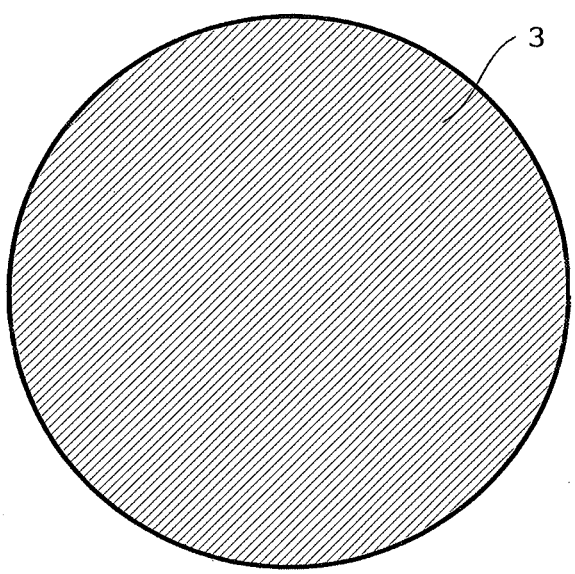
FIG. 12 is a top plan view illustrating a susceptor employed in the induction heating apparatus of the related art.

At least, the power supply unit 20 includes an inverter capable of controlling the supplied electric current and a power supply that supplies electric power to the inverter (a relationship between the inverter and the power supply will be described in Embodiment 2: refer to FIGS. 9 and 10). As the inverter, a non-resonant inverter as well as a resonant inverter may be employed. Specifically, for example, as the resonant inverter, a series resonant inverter may be employed. In addition, as the non-resonant inverter, a pulse width modulation (PWM) inverter may be employed.

As the power supply, an AC power supply is employed. Specifically, a three-phase AC power supply and the like may be employed. In addition, in a case where a series resonant inverter is employed as an inverter, a converter or a chopper may be preferably provided between the power supply and the inverter. The converter rectifies the AC current supplied from the three-phase AC power supply to a DC current. The chopper regulates a voltage of the DC current rectified by the converter. In this configuration, the series resonant inverter may only regulate the electric current output at a predetermined resonant frequency. Meanwhile, in a case where a PWM inverter is employed, at least a converter may be preferably provided between the power supply and the inverter. Here, similar to a case where the series resonant inverter is employed, the converter converts the AC current to the DC current. The PWM inverter converts the DC current output from the converter into an AC current and supplies the AC current to the induction heating coil. Here, the PWM inverter may supply an AC current by performing ON/OFF control for the input DC current and regulate a frequency and a voltage by outputting an equivalent voltage determined by a duty ratio of each pulse width as a sinusoidal wave depending on a signal given as an instruction frequency. Furthermore, according to the present embodiment, the PWM inverter may regulate an electric current.

In the induction heating apparatus 10 described above, it is possible to perform uniform heating even when large-diameter wafers 40 are heated using a batch-type heating system.

In a case where the wafer 40 is heated using the induction heating apparatus 10 having such a configuration, a frequency of an electric current at which the large-diameter, middle-diameter, and small-diameter inductive-heating target members 14 can be uniformly heated may be investigated in advance, and this frequency of the electric current obtained from this investigation may be preferably used as a reference frequency for driving. If such a reference frequency is employed, it is possible to increase a heating rate in the center side of the susceptor 12 by setting the frequency of the electric current supplied to the induction heating coil 18 to be lower than the reference frequency. Meanwhile, if the frequency of the electric current supplied to the induction heating coil 18 is set to be higher than the reference frequency, it is possible to increase a heating rate in the outer circumference side of the susceptor 12. As a result, it is possible to control the in-plane temperature distribution of the wafer 40 as a heating target by controlling the frequency of the supplied electric current.

Figure 3:
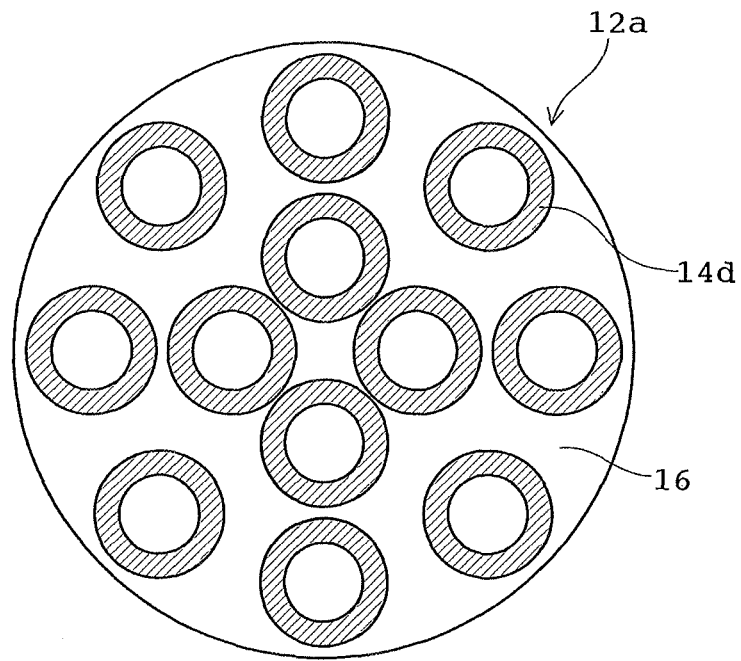
FIG. 3 is a top plan view illustrating a susceptor according to a first application.

According to the embodiment described above, the inductive-heating target member 14 of the susceptor has a circular disc shape. However, as illustrated in FIG. 3, the inductive-heating target member 14d may have a ring shape. If the susceptor 12a is configured by including the inductive-heating target member 14d in this manner, a transmission path of the magnetic flux from the induction heating coil 18 is widened. Therefore, it is possible to further suppress a temperature distribution bias in the inductive-heating target member 14d.

According to the embodiment, it is assumed that the inductive-heating target members 14 have the same thickness. However, the thickness of the inductive-heating target member 14 may be changed depending on the classification thereof. For example, the thickness may be gradually reduced from the large-diameter inductive-heating target member 14a arranged in the center to the small-diameter inductive-heating target member 14c arranged in the outer edge side. In this configuration, it is possible to obtain a heat generation amount necessary in the center where a magnetic flux reaches in difficulty. Therefore, it is possible to uniformize a heat distribution in the entire susceptor 12. Naturally, both a thick portion and a thin portion may be provided in a single inductive-heating target member 14. In this case, the center of each inductive-heating target member 14 may be preferably thickened, and the outer circumference side may be preferably thinned.

Figure 4:
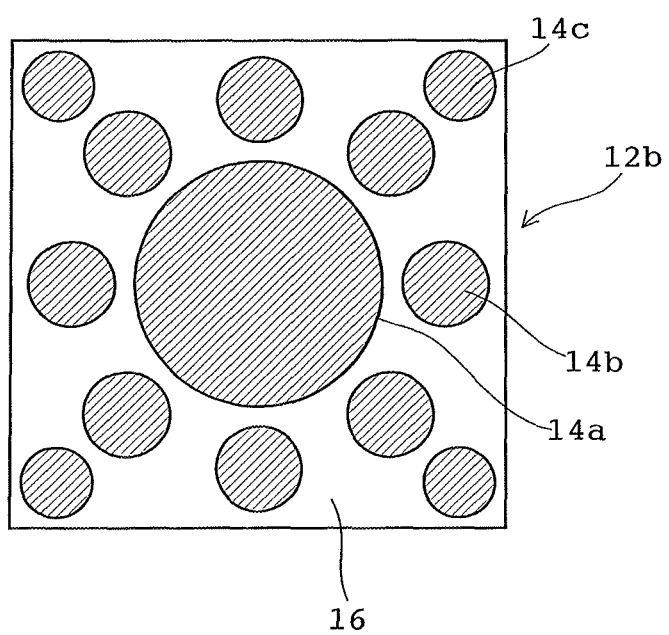
FIG. 4 is a top plan view illustrating a susceptor according to a second application.

According to the aforementioned embodiment, the holder 16 has a circular disc shape. On the contrary, the exterior of the susceptor 12b may have a rectangular shape as illustrated in FIG. 4. If the susceptor 12b has such a configuration, it is possible to advantageously perform uniform heating, for example, when a rectangular wafer such as a wafer employed in a solar cell is epitaxially grown.

Figure 5:
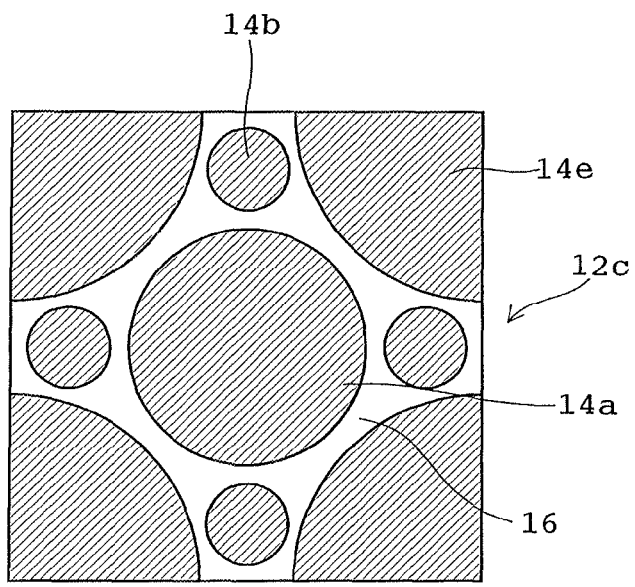
FIG. 5 is a top plan view illustrating a susceptor according to a third application.

Furthermore, in a case where the exterior of the susceptor 12c has a rectangular shape, the inductive-heating target members 14e arranged in four corners of the rectangular shape may have a fan shape in a plan view as illustrated in FIG. 5. In the induction heating, the magnetic flux tends to be concentrated on the edge portion. For this reason, if the fan-shaped inductive-heating target members 14e are arranged in four corners of the rectangular susceptor 12c by directing the edges to the apexes of the rectangle, it is possible to suppress reduction of the heat generation in the apexes (four corners) where a heat generation amount is large.

Figure 6:
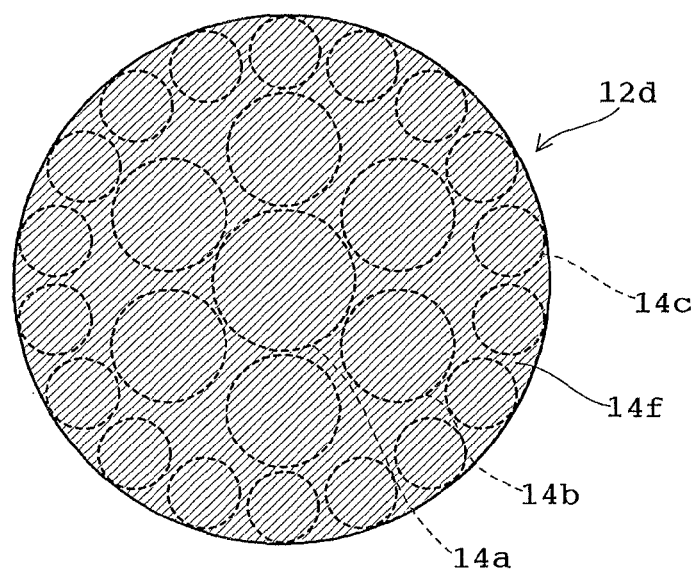
FIG. 6 is a top plan view illustrating a susceptor according to a fourth application.
Figure 7:
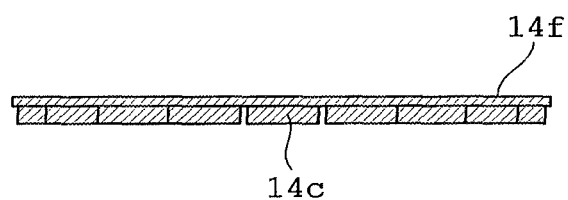
FIG. 7 is a side view illustrating the susceptor according to the fourth application.

Alternative examples of the susceptor are illustrated in FIGS. 6 and 7. Specifically, a thin inductive-heating target member 14f (for example, graphite) has a size similar to that of the susceptor 12d, and thick inductive-heating target members 14a to 14c having a large diameter, a middle diameter, and a small diameter, respectively, are arranged on a surface opposite to the surface where the wafer 40 is disposed in the thin inductive-heating target member 14f. Here, a thickness of the inductive-heating target member 14f may be preferably set to be thin so as not to hinder a flow of the magnetic flux transmitting along a layering direction of the susceptors 12d. Because even when such a configuration is provided, it is possible to obtain similar effects as those of the susceptor 12 described in the aforementioned embodiment.

Figure 8:
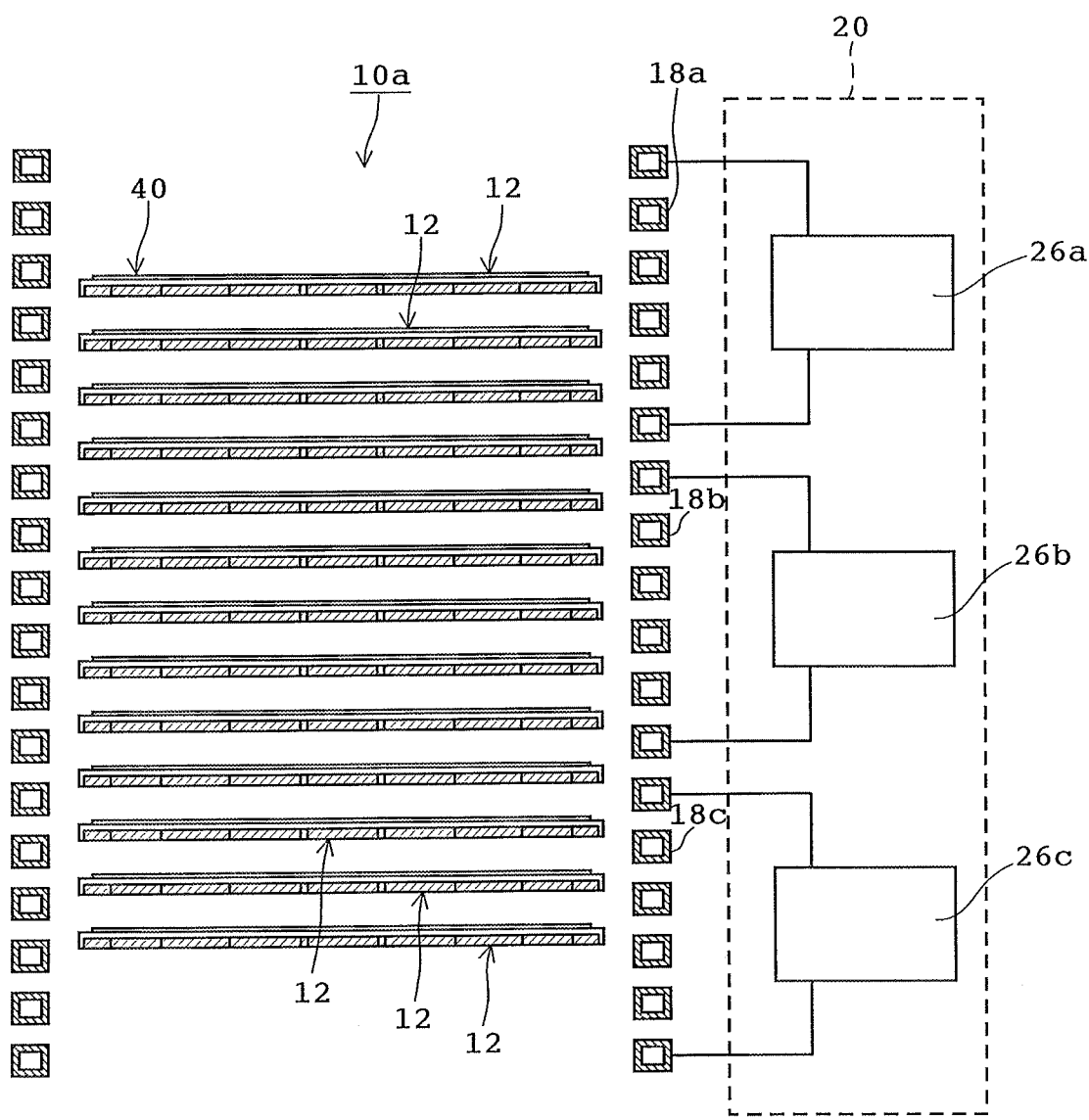
FIG. 8 is a block diagram illustrating a front configuration of an induction heating apparatus according to Embodiment 2.

Next, an induction heating apparatus according to Embodiment 2 of the present invention will be described in detail with reference to FIGS. 8 and 9. Here, FIG. 8 is a block diagram illustrating a front configuration of the induction heating apparatus according to the present embodiment, and FIG. 9 is a block diagram for describing a detailed configuration of the power supply unit.

Most of the elements of the induction heating apparatus 10a according to the present embodiment are similar to those of the induction heating apparatus 10 according to Embodiment 1 described above. For the portions where similar functionalities are provided, like reference numerals denote like elements as in Embodiment 1, and description thereof will not be repeated. The induction heating apparatus 10a according to Embodiment 2 is different from the induction heating apparatus 10 according to Embodiment 1 in that the number of layers of the susceptors 12 increases, and the number of induction heating coils 18 enclosing the susceptors 12 increases as the number of layers of the susceptors 12 increases. In the example of FIGS. 8 and 9, three induction heating coils 18a, 18b, and 18c are closely arranged along a layering direction of the susceptors 12. In other words, it can be said that the induction heating coils 18a, 18b, and 18c according to the present embodiment are obtained by dividing a single induction heating coil into three ones along the layering direction of the susceptors 12.

Here, in a case where a plurality of induction heating coils 18a, 18b, and 18c are closely arranged, it may be difficult to control an electric current supplied from the power supply unit 20 due to influence of the mutual induction between neighboring induction heating coils 18a, 18b, and 18c. In this regard, in the induction heating apparatus 10a according to the present embodiment, a phase control unit 28 is provided in the power supply unit 20, and the inverters 26a, 26b, and 26c are connected to the induction heating coil 18a, 18b, and 18c, respectively. In the configuration illustrated in FIG. 9, a PWM inverter is exemplarily employed as the inverters 26a, 26b, and 26c.

The phase control unit 28 detects electric currents output from the inverters 26a, 26b, and 26c to the induction heating coils 18a, 18b, and 18c, respectively, to match frequencies of the detected electric currents and detects phases of the output electric currents to perform control such that a phase difference between the electric currents output from each inverter 26a, 26b, and 26c becomes zero or is maintained at a predetermined value. The control of the phases of the electric currents may be performed by instantaneously changing the frequency of the output electric current.

In this configuration, a temperature distribution can be controlled in the unit of the heating area of each induction heating coil 18a, 18b, and 18c divided along the layering direction even when the number of layers of the susceptors 12 increases.

In the aforementioned embodiment, the description has been made by focusing on a PWM inverter employed as the inverters 26 (26a, 26b, and 26c). On the contrary, in a case where a series resonant inverter is employed, the configuration illustrated in FIG. 10 may be satisfactory. That is, the inverters 26a1, 26b1, and 26c1 and the choppers 27a, 27b, and 27c are connected to the induction heating coils 18a, 18b, and 18c, respectively. Each chopper 27a, 27b, and 27c is connected in parallel with the converter 24 connected to the power supply 22. The resonant capacitors 32 arranged in parallel with each other are connected to the inverters 26a1, 26b1, and 26c1, respectively, in series to match a reference frequency for uniform heating, a high frequency for heating the outer circumference side, and a low frequency for heating the center, respectively, so that they can be selectively switched using a switch 30 and the like. In this configuration, even when a PWM inverter is employed as the inverter to provide the series resonant inverters 26a1, 26b1, and 26c1, it is possible to provide similar effects.

EXPLANATIONS OF LETTERS OR NUMERALS

10 INDUCTION HEATING APPARATUS
12 SUSCEPTOR
14 (14a, 14b, and 14c) INDUCTIVE-HEATING TARGET MEMBER
16 HOLDER
18 INDUCTION HEATING COIL
20 POWER SUPPLY UNIT

The invention claimed is:

1. An induction heating apparatus, comprising:
a plurality of inductive-heating target members;
a single holder housing the plurality of inductive-heating members interspersed therein;
a solenoid coil operatively positioned to generate magnetic flux to heat the plurality of inductive-heating members;
a single heating target operatively positioned on an upper surface of the holder to be heated by the plurality of inductive-heating members; and
a power supply unit configured to adjust an electric current frequency to the solenoid coil,
wherein each of the plurality of inductive-heating target members has a principal surface arranged perpendicularly to a core axis direction of the solenoid coil,
the single holder having magnetic permeability and heat conductivity,
each of the plurality of inductive-heating target members has a circular shape and are interspersed radially by using a center of the holder as an origin,
at least one of the plurality of inductive-heating target members arranged in the center of the holder has a diameter larger than that of an inductive-heating target member arranged in the vicinity of an outer periphery side of the holder, and
a portion of an inductive-heating target member is selectively heated depending on a diameter of the inductive-heating target member in response to adjusting the electric current frequency of the power supply unit.

2. The induction heating apparatus according to claim 1, wherein the inductive-heating target member arranged in the center of the holder has a thickness larger than that of the inductive-heating target member arranged in an outer circumference side of the holder.

3. An induction heating apparatus, comprising:
a plurality of inductive-heating target members;
a single holder housing the plurality of inductive-heating members interspersed therein;
a solenoid coil operatively positioned to generate magnetic flux to heat the plurality of inductive-heating members;
a single heating target operatively positioned on an upper surface of the holder to be heated by the plurality of inductive-heating members; and
a power supply unit configured to adjust an electric current frequency to the solenoid coil,
wherein each of the plurality of inductive-heating target members has a principal surface arranged perpendicularly to a core axis direction of the solenoid coil,
the single holder made of a member having magnetic permeability and heat conductivity,
each of the plurality of inductive-heating target members are interspersed radially by using a center of the holder as an origin,
at least one of the plurality of inductive-heating target member members arranged in the center of the holder has a thickness larger than that of an inductive-heating target member arranged in an outer circumference side of the holder, and
a portion of an inductive-heating target member is selectively heated depending on a diameter of the inductive-heating target member in response to adjusting the electric current frequency of the power supply unit.

4. The induction heating apparatus according to claim 1, wherein a through-hole is formed in each center of the circular inductive-heating target members so that each inductive-heating target member has a ring shape.

5. The induction heating apparatus according to claim 1, wherein the inductive-heating target member arranged in a center side of the heat generator is a first inductive-heating target member, and the inductive-heating target member arranged in an outer circumference side of the heat generator is a second inductive-heating target member,
the first inductive-heating target member can obtain a heat density higher than that of the second inductive-heating target member when a frequency of an electric current supplied to the solenoid coil of the first inductive-heating target member is lower than that of the second inductive-heating target member.

6. The induction heating apparatus according to claim 3, wherein the inductive-heating target member arranged in a center side of the heat generator is a first inductive-heating target member, and the inductive-heating target member arranged in an outer circumference side of the heat generator is a second inductive-heating target member,
the first inductive-heating target member can obtain a heat density higher than that of the second inductive-heating target member when a frequency of an electric current supplied to the solenoid coil of the first inductive-heating target member is lower than that of the second inductive-heating target member.

7. The induction heating apparatus according to claim 1, wherein a thin portion and a thick portion are formed in the inductive-heating target member.

8. The induction heating apparatus according to claim 1, wherein a plurality of the heat generators are arranged in an enclosed space of the solenoid coil in parallel with each other.

9. The induction heating apparatus according claim 3, wherein a plurality of the heat generators are arranged in an enclosed space of the solenoid coil in parallel with each other.

* * * * *